United States Patent
Poplevine et al.

(10) Patent No.: US 6,563,730 B1
(45) Date of Patent: May 13, 2003

(54) LOW POWER STATIC RAM ARCHITECTURE

(75) Inventors: Pavel Poplevine, Foster City, CA (US); Hengyang Lin, San Jose, CA (US); Andrew J. Franklin, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/119,191

(22) Filed: Apr. 9, 2002

(51) Int. Cl.⁷ .............................................. G11C 11/00
(52) U.S. Cl. .................................. 365/154; 365/189.01
(58) Field of Search .............................. 365/154, 189.01

(56) References Cited

U.S. PATENT DOCUMENTS

| | | | |
|---|---|---|---|
| 4,300,212 A | 11/1981 | Simko | 365/185 |
| 4,400,799 A | 8/1983 | Gudger | 365/95 |
| 4,408,303 A | 10/1983 | Guterman et al. | 365/205 |
| 4,541,076 A | 9/1985 | Bowers et al. | 365/190 |
| 4,580,245 A | 4/1986 | Ziegler et al. | 365/154 |
| 4,772,930 A | 9/1988 | Anami et al. | 357/42 |
| 4,912,471 A | 3/1990 | Tyburski et al. | 342/42 |
| 4,935,734 A * | 6/1990 | Austin | 340/825.83 |
| 5,307,352 A | 4/1994 | Moench | 370/112 |
| 5,365,123 A | 11/1994 | Nakase et al. | 326/109 |
| 5,644,155 A | 7/1997 | Lien | 257/401 |
| 5,845,322 A | 12/1998 | Leung | 711/151 |
| 5,903,137 A | 5/1999 | Freiman et al. | 320/163 |
| 5,909,222 A | 6/1999 | Umeshima | 345/437 |
| 6,260,097 B1 | 7/2001 | Farmwald et al. | 710/129 |

* cited by examiner

Primary Examiner—M. Tran
(74) Attorney, Agent, or Firm—Stallman & Pollock LLP

(57) ABSTRACT

A static RAM bit cell and a system and method for operating an array of such static RAM bit cells. The static RAM bit cell herein includes a cell of four transistors configured to store data. It also includes a pair of word line pass transistors and a pair of column pass transistors coupled to the cell of four transistors. The word line pass transistors are coupled to a word line such that they can be opened in closed in response to a signal on the word line. The column pass transistors are coupled to a column select transistor such that they can be opened and closed in response to a signal on the column select line. Using this configuration signals can be generated on the word line and the column select line so that only a small fraction of the total number of static RAM bit cells in an array need to be charged and discharged in connection with performing read and write operations to a specific static RAM bit cell.

14 Claims, 6 Drawing Sheets

LOW POWER STATIC RAM ARCHITECTURE

TECHNICAL FIELD

The present invention relates to the field of static random access memory (SRAM) cells, and SRAM memory architecture providing for low ac power consumption.

BACKGROUND OF THE INVENTION

FIG. 1 shows a SRAM memory array architecture of the prior art. This architecture utilizes a six transistor memory cell 200 as shown in FIG. 2. The six transistor SRAM bit cell 200 shown in FIG. 2 includes a first supply voltage, VDD 217, and a ground connection 218. The cell also includes a word line WLC. Bit lines BTC and BBC provide a connection to read and write data to the cell. The bit cell also includes a storage cell which includes four transistors, 206, 208, 210, 212, configured to store data. As is known in the art, transistors 206 and 208 act as load transistors and transistors 210 and 212 act as cross coupled storage transistors. As shown in the embodiment 200, the load transistors 206 and 208 are PMOS transistors, and 210 and 212 are NMOS transistors. Transistors 214 and 216 are word line, or row select, pass transistors.

In a static mode, when the cells in the memory array are not in write or read mode, bit lines BTC and BBC, shown in FIG. 2, are precharged to a VDD level. And the word line shown in FIG. 2 as WLC is at logic zero, which in most cases will be approximately ground. In this static state, a programmed cell can maintain the information equivalent to logic 0 or logic 1, since n-channel devices 214 and 216 are off, which isolates the storage cell that includes devices 206, 208, 210 and 212.

In a write mode, the WLC line which is coupled to a row of cells (e.g. N00, N01 . . . N0MM), as shown in FIG. 1, which contains the cell being written to is driven to logic 1 or VDD. To write to the cell to be programmed to store a binary 1, the bit line BTC for the cell being written to is driven to logic 0, and the bit line BBC is driven to logic 1. This results in the cell being programmed to logic 1, where the voltage at node 202 will be set at logic 1 and the voltage at node 204 will be set at logic 0 as is known in the art. To program the cell to logic 0 the bit line BTC is driven to logic 1 and the bit line BBC is driven to logic 0, such that 202 will be set at logic 0 and 204 will be set at logic 1 as is known in the art.

In the static mode, in between read and write operations, the bit lines BTC and BBC are held at a precharge voltage VDD using the PMOS transistors 102 of the precharge circuit 106. In the static mode the word line (WL0, WL1, . . . WLN) pass transistors shown in FIG. 2 (214 and 216) are held closed as the WLC voltage is at logic zero. To read the data from the cell the WLC voltage is changed to logic 1. The signal of voltage logic 1 on WLC is applied to the gates of the word line pass transistors 214, and 216, which opens the word line pass transistors 214 and 216, so that current can flow through the transistors. In addition to changing the WLC voltage being set to logic 1, the precharge circuit is closed so that the bit lines BTC and BBC are allowed to float. With the word line pass gate transistors open one of the bit lines BTC and BBC will discharge depending on which node 202 or 204 is at zero. For example if the cell is programmed at logic 1 then the BTC bit line will discharge through the NMOS transistor 214 and the cross coupled storage transistor 210, and BBC would remain floating at the VDD level. If the cell was programmed at logic 0 then BBC would discharge through 216 and 212, and BTC would remain at VDD. The switch (SW0, SW1 . . . SWM) connected to the cell which is being read will be closed and the sense circuitry 104 will read the difference in voltage in the bit lines BTC and BBC to determine whether the data is 1 (one) or 0 (zero).

In the prior art Static Random Access (SRAM) memory architecture 100 as shown in FIG. 1, there are three stages of operation. At stage 1 memory read/write operations require that all bit lines (BT0, BB0, BT1, BB1, . . . BTM, BBM) be precharged to logic 1 by the precharge circuitry 106, the precharge circuitry provides PMOS transistors 102, which in the static mode are opened by a PRCHG voltage signal 108 being at logic 0, which is applied to the gates of the PMOS transistors 102. Also all word lines (WL0, WL1, . . . WLN) are set to logic 0 before read read/write operation for any cell occurs.

At stage 2 of the memory read/write mode all are of the PMOS transistors 102 are closed (PRCHG voltage 108 is set to logic 1), so that the voltage on the bit lines is allowed to float, instead of being held at VDD. One of the word lines (e.g. WL0) is driven to logic 1. All the 6T (6-transistor)core memory cells (i.e. bit cells N00, N0 . . . N0M) coupled to this word line begin to discharge the bit lines (e.g. BT0, BB, BT1, BB1 . . . BTM, BBM). The discharge of the bit lines at this stage causes a large active AC power dissipation.

Stage 3 of the memory bit cell read/write operation is selecting one of the switches (SW0, SW1, . . . SWM) in the MUX block 103 by setting Y0, Y1 . . . or YM to logic 1. As shown in FIG. 1, Y0 is set selecting column 1. To write data to a bit cell at this stage requires using a write circuit 104 to program the selected individual bit cell, by applying a voltage differential to bit lines BT0 and BB0. (The write circuitry and sense circuitry is known to one of skill in the art, and shown as block 104 in FIG. 1.) To read data from the bit cell requires amplifying the differential signal between the bit lines BTC and BBC using a sense amplifier and then routing this to an output circuit.

Regardless of which mode is used, whether read or write, and what MUX switch will be closed, a bit line for each column of SRAM memory bit cells of the complete array will be discharged during every read/write operation before a new read/write cycle can begin, and the array has to precharged again. This is because the same PRCHG signal is applied to the gates of all of the PMOS transistors 102 of the precharge circuit 106, and all of the bit cells coupled to word line with logic 1 have word line pass transistors (e.g., 214 and 216) which are opened as a result of the word line generating a logic 1 signal.

One problem with this prior approach is that, for each read/write cycle, enough power to precharge and discharge all of the bit line pairs in the array is consumed, while all that is really needed is to program or read information for one bit line pair (e.g. BTC and BBC) during each read or write cycle. In the past, one technique employed to reduce the amount of AC power dissipated is to employ a multi bank architecture, that reduces the number of switches (SW) per sense amplifier block and so allows for selection of a particular bank of bit lines, corresponding to an array of bit cells, and thus only the array of bit cells corresponding to the selected bank of bit lines has to be precharged, thereby reducing the power required at the static stage. One issue with this approach is that it requires additional logic for determining with bank of bit lines to select and can requires additional sensing and write circuitry, and it still consumes enough power to precharge and discharge all bit line pairs in the selected bank.

The invention herein provides a system and method which allows for selecting and discharging only the bit lines that are coupled to the selected bit cell.

SUMMARY

The present invention is directed to a static RAM bit cell and a system and method for operating an array of such static RAM bit cells. The static RAM bit cell of the present invention includes a storage cell configured to store data. It also includes a pair of word line pass transistors and a pair of column pass transistors coupled to the storage cell. The word line pass transistors are coupled to a word line such that they can be opened or closed in response to a signal on the word line. The column pass transistors are coupled to a column select transistor such that they can be opened and closed in response to a signal on the column select line. Using this configuration, signals can be generated on the word line and the column select line so that only a fraction of the total number of static RAM bit cells in an array need to be charged and discharged in connection with performing read and write operations to a specific static RAM bit cell.

The features and advantages of the present invention will be more fully appreciated upon consideration of the following detailed description of the invention and the accompanying drawings, which set forth an illustrative embodiment in which the principles of the invention are utilized.

DETAILED DESCRIPTION OF THE INVENTION

Figure 4:
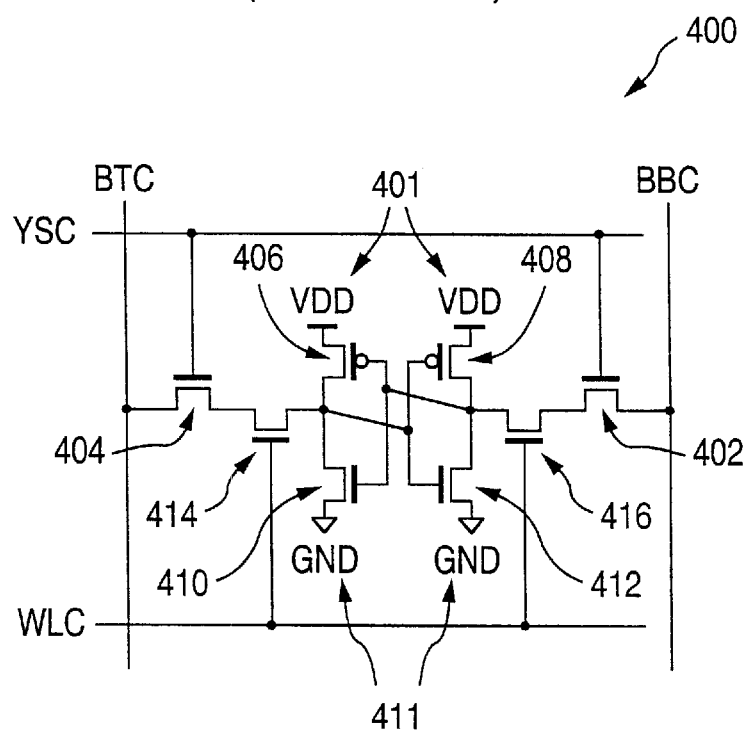
FIG. 4 is a view of an SRAM bit cell of the present invention.
Figure 3:
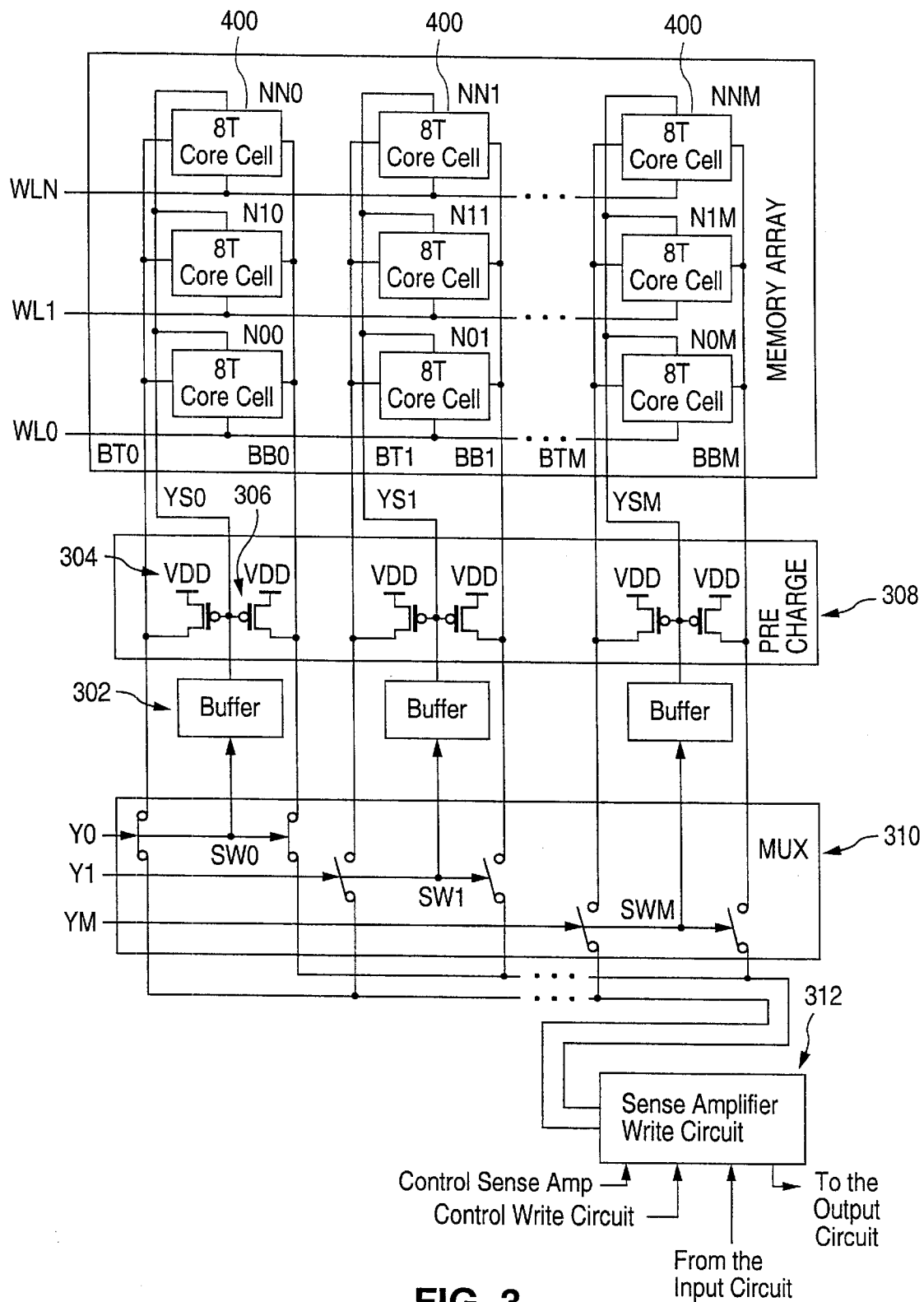
FIG. 3 is a view of the SRAM memory system of the present invention.

FIG. 3 shows an embodiment of the present invention. As shown in FIG. 3, the 6T bit cell is replaced with a 8T (8-tansistor) bit cell. The 8T bit cell 400 is shown in detail in FIG. 4. As shown in FIGS. 3 and 4, an additional control signal YSC is coupled to the 8T bit cell 400. This additional control signal YSC is coupled to column select pass transistors 402 and 404. This additional control signal YSC is a column select signal which is orthogonal to the word line WLC control signal in that is connected to a column of 8T bit cells 400, while the WLC control signal is coupled to a row of 8T bit cells. Using the YSC and WLC signals, a specific 8T bit cell can be selected. As a result, in the memory array 300 during the read or write mode, a single pair of bit lines (e.g. BTC and BBC) coupled to a selected 8T bit cell can be selected for discharge and reading and writing. The general operation of the read or write mode is the same as discussed above in connection with the 6T bit cell arrays, but the YSC signal must be used in conjunction with the WLC signal as described herein.

A static stage of operation provides that all the bit lines (e.g. BTC and BBC) be precharged to logic 1. At this stage all the YSC lines are at logic 0. The column select pass transistors (e.g. 402 and 404) having logic 0 applied to the gates are held in a closed state so that current does not pass through the transistors 402 and 404. Similarly, the WLC line is at logic 0 and thus the row select pass transistors are closed so that no current can pass through them.

The eight transistor SRAM bit cell 400 shown in FIG. 4 includes a first supply voltage, VDD 401, and a ground connection 411. The cell also includes a word line WLC. Bit lines BTC and BBC provide a connection to read and write data to the cell. The bit cell also includes a cell of four transistors, 406, 408, 410, 412, configured to store data. As is known in the art, transistors 406 and 408 act as load transistors and transistors 410 and 412 act as cross-coupled storage transistors. As shown in the embodiment 400, the load transistors 406 and 408 are PMOS transistors, and 410 and 412 are NMOS transistors. Transistors 414 and 416 are word line pass transistors, also referred to as a row select pass transistors. Coupled to the row select pass transistors 414 and 416 are the column select transistors 404 and 402.

In a second stage of operation a single column is selected by control signal YSC. As shown in FIG. 3 column 0 is selected by signal Y0 being set to logic 1. Y0 going to logic 1 will result in the signal being routed through the buffer 302 and corresponding signal of logic 1 being generated on the column select line YS0. The column select line YS0 is coupled to the column select pass transistors (e.g. 402 and 404) of the 8T bit cells 400 in column 0. When the voltage on YS0 goes to logic 1 the column select transistors will open due to the voltage applied at the gates of the NMOS transistors 402 and 404. At this point the desired word line is also driven to logic 1. For example WL0 could be driven to logic 1, which would cause the row select pass transistors (e.g. 414 and 416) for the 8T bit cells in row 0 to open allowing current through the row select pass transistors of row 0. Thus, with YS0 and WL0 driven to logic 1 current can flow through the column select pass transistors (402 and 404) and row select transistors (414 and 416) of column 0 and row 0 (i.e. bit cell N00). Where YS0 and WL0 are driven to logic 1 N00 would be the only bit cell where both the row select pass and column select pass transistors (402, 404, 414, 416) are open. The signal on the YS0 column select line is also coupled to a precharge circuit 308, and more specifically to a pair of PMOS transistors 304 and 306. The transistors 304 and 306 are coupled to the bit lines BT0 and BB0 which are coupled to the 8T bit cell (N00).

When in the static stage of operation the signal on YS0 is at logic 0 and the PMOS transistors 304 and 306 are opened which holds the voltage on the bit lines BT0 and BB0 at the precharge voltage VDD. In a second stage of operation the voltage on the column select line YS0 goes to 1. Because YS0 is coupled to both the column select pass transistors of the 8T bit cells in column 0, and the precharge transistors 304 and 306, when the voltage on YS0 goes to logic 1 the precharge PMOS transistors 304 and 306 close and the NMOS column select pass transistors 402 and 404 for the 0 column open. Thus, the voltage on the bit lines BT0 and BB0 is allowed to float. When the row select pass transistor is also open either the bit line BT0 or BB0 will discharge through the column select pass transistor and the row select pass transistor and through one of the cross coupled storage transistors 410 or 412 depending on whether the bit cell stores either 1 or 0.

Because only column 0 is selected (using the YS0 and WL0 lines) only the pair of bit lines BT0 and BB0 will discharge in order to complete the read or write cycle for the 8T bit cell (N00). The other bit lines in the memory array of 300 would be maintained at a precharge logic 1 because the remainder of the precharge PMOS transistors in the precharge circuit 308, which are controlled by the other YS signals (YS1, . . . YSM) would hold the PMOS precharge transistors open. Thus, the other bit lines would remain in static operation. Indeed all the other columns of the array 300 would have column select lines at logic 0, so all the column select pass transistors (e.g. 404 and 402) would remain closed and the bit lines for the other columns of 8T bit cells would be maintained in a static mode.

A third stage of the read write operation is closing one of the switches (SW0, SW1, . . . SWM) in the MUX block 310 in response to setting one of lines Y0, Y1 or . . . YM to logic 1. To write data to a bit cell at this stage requires using the write circuit 312. To read data from the bit cell requires amplifying the differential signal between the bit line pair BTC and BBC using the sense amplifier 312 and then routing this to an output circuit.

The MUX of the memory system can have a varying number of switches depending on the number of columns in the array of 8T bit cells. The larger the number of columns the more power that can be saved by using the present invention, because using the prior art system 100 all of the columns go through a precharge and discharge cycle each time a read or write operation is performed. Thus, if a system can have MUX options of 4, 8 or 16, then the corresponding power consumption can be reduced by a factor of 1:4, 1:8 and 1:16 respectively. As one of skill in the art will appreciate one could employ the system described herein in a dual port static RAM bit cell, as well as the single port bit cell as described herein.

Figure 5:
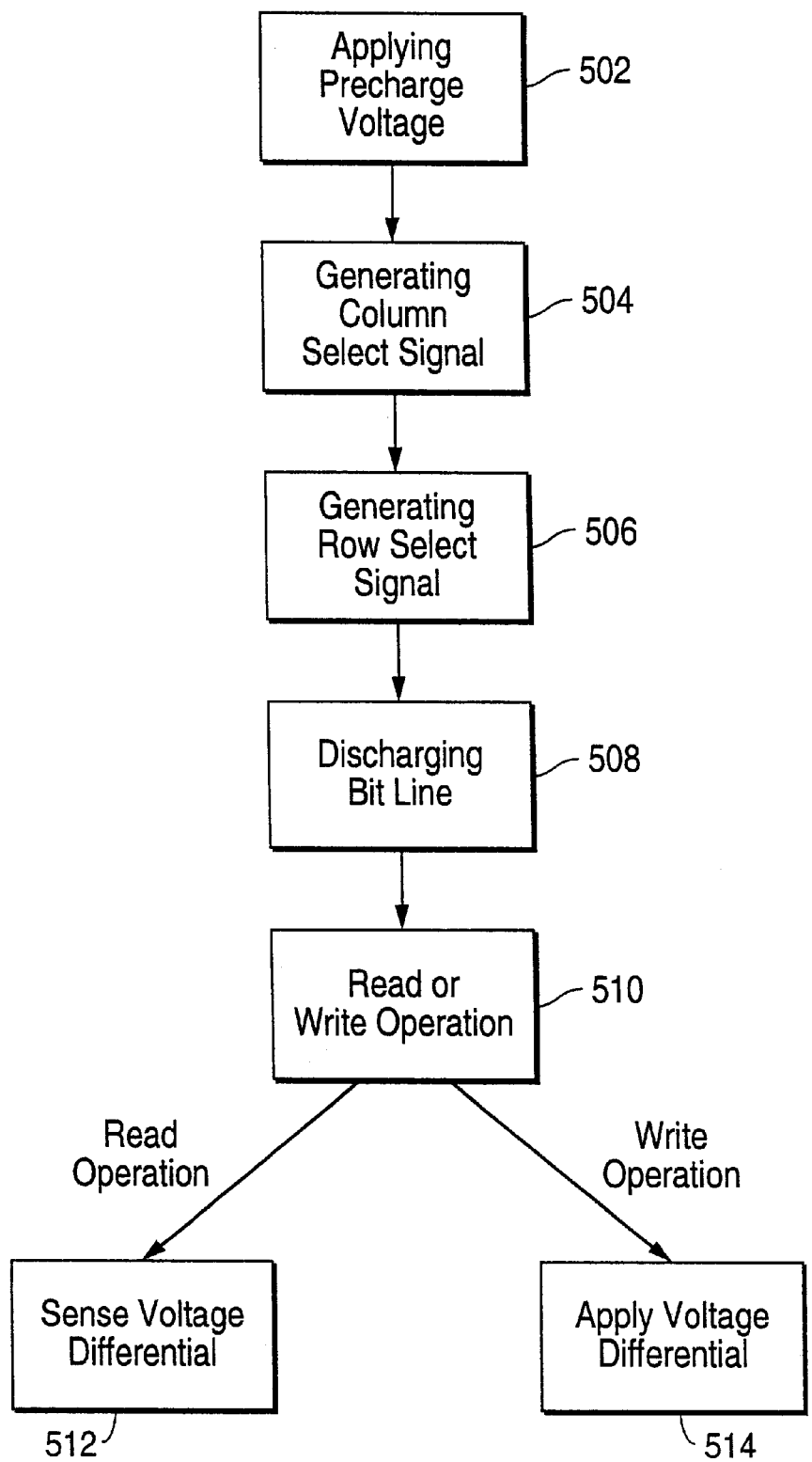
FIG. 5 is a view of a flow chart showing a method of the present invention.

FIG. 5 shows a flow chart of a method of the present invention. The method of the present invention, as was discussed above in connection with FIGS. 3 and 4, includes applying a precharge voltage 502 to the bit lines of the static RAM cells to precharge the array. In order to read from the cell, or to write data to the cell, a column select signal is generated 504. As discussed above the column select signal operates to open column select pass transistors so that current can flow through the transistor. Additionally, a row select signal is also generated 506 and applied to row select pass transistors. The row select signal operates to open row select transistors so that current can flow through the row select transistors of the selected cell. In addition to generating row select and column select signals, a signal is applied to a precharge circuit which results in a discontinuation of precharge voltage being applied to bit lines coupled to a bit cell which is being written to or read from. At this point the bit lines corresponding to the memory cell being written to or read form are discharged 508. Depending on whether a cell is being written to or read from 510 different operations are conducted. If the data is being read from a selected cell then after the bit lines are discharged a voltage differential is sensed 512 between the pair of bit lines coupled to the bit cell being read from. If data is being written to a selected cell then after the bit lines are discharged a voltage differential is applied between the pair of bit lines coupled to the bit cell being written to 514.

Figure 1:
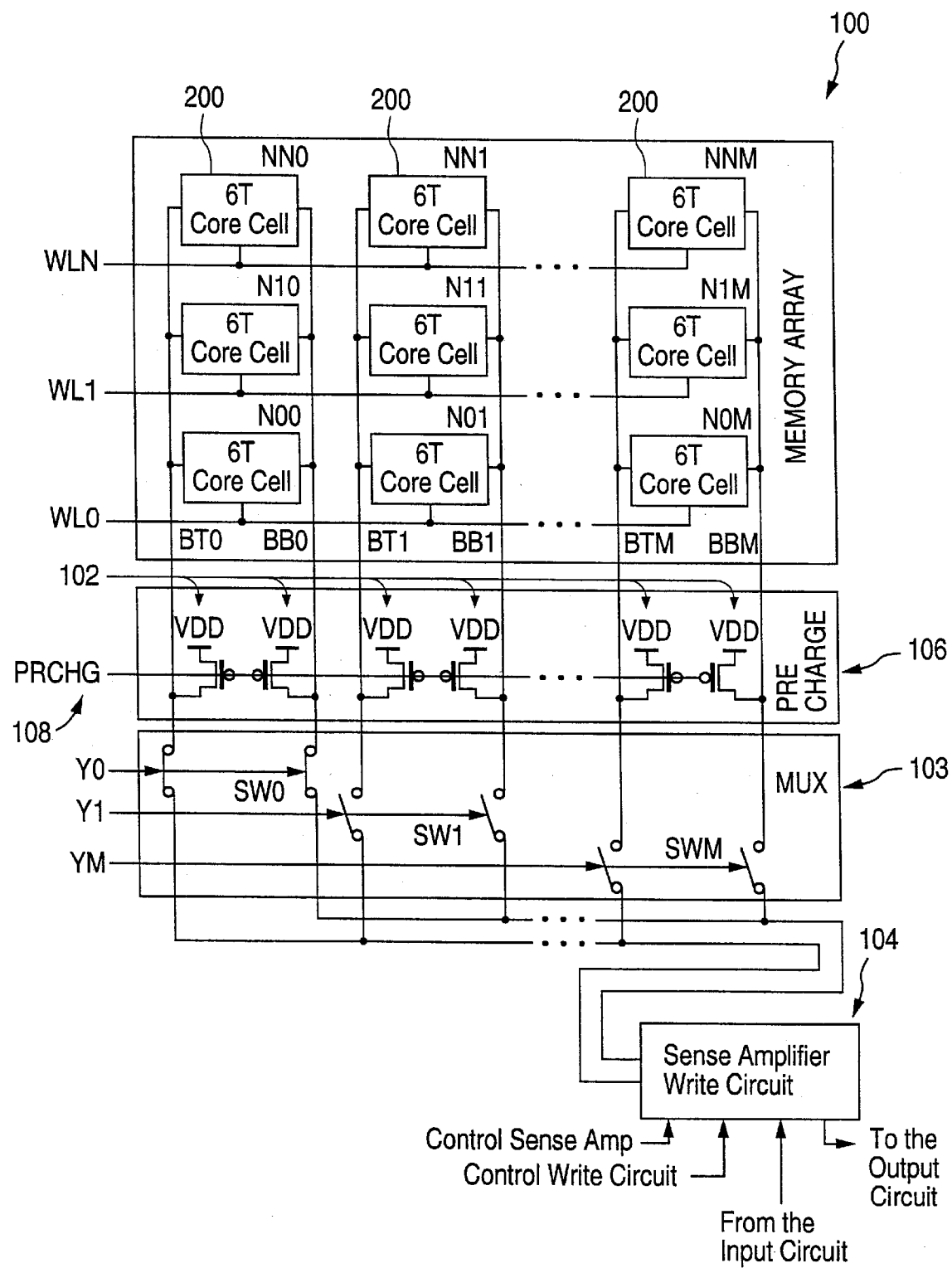
FIG. 1 is a view of an SRAM system of the prior art.
Figure 2:
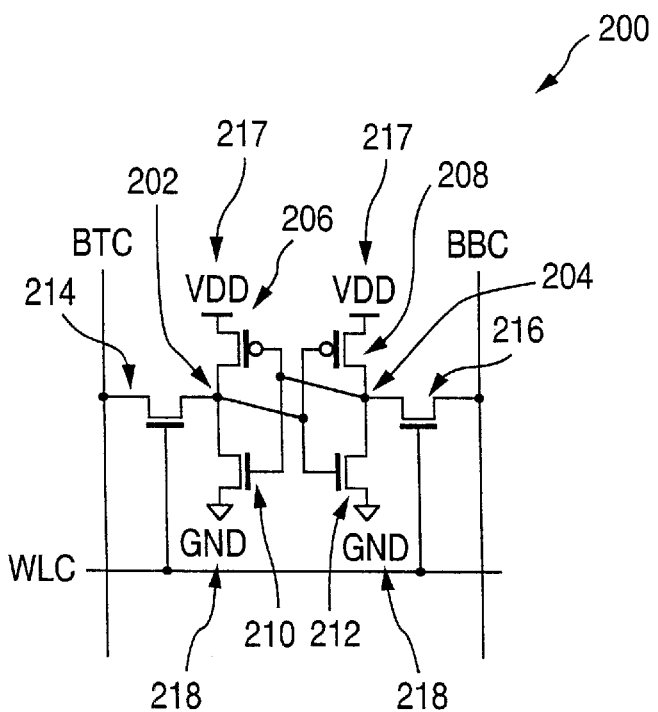
FIG. 2 is a view of an SRAM bit cell of the prior art.
Figure 6:
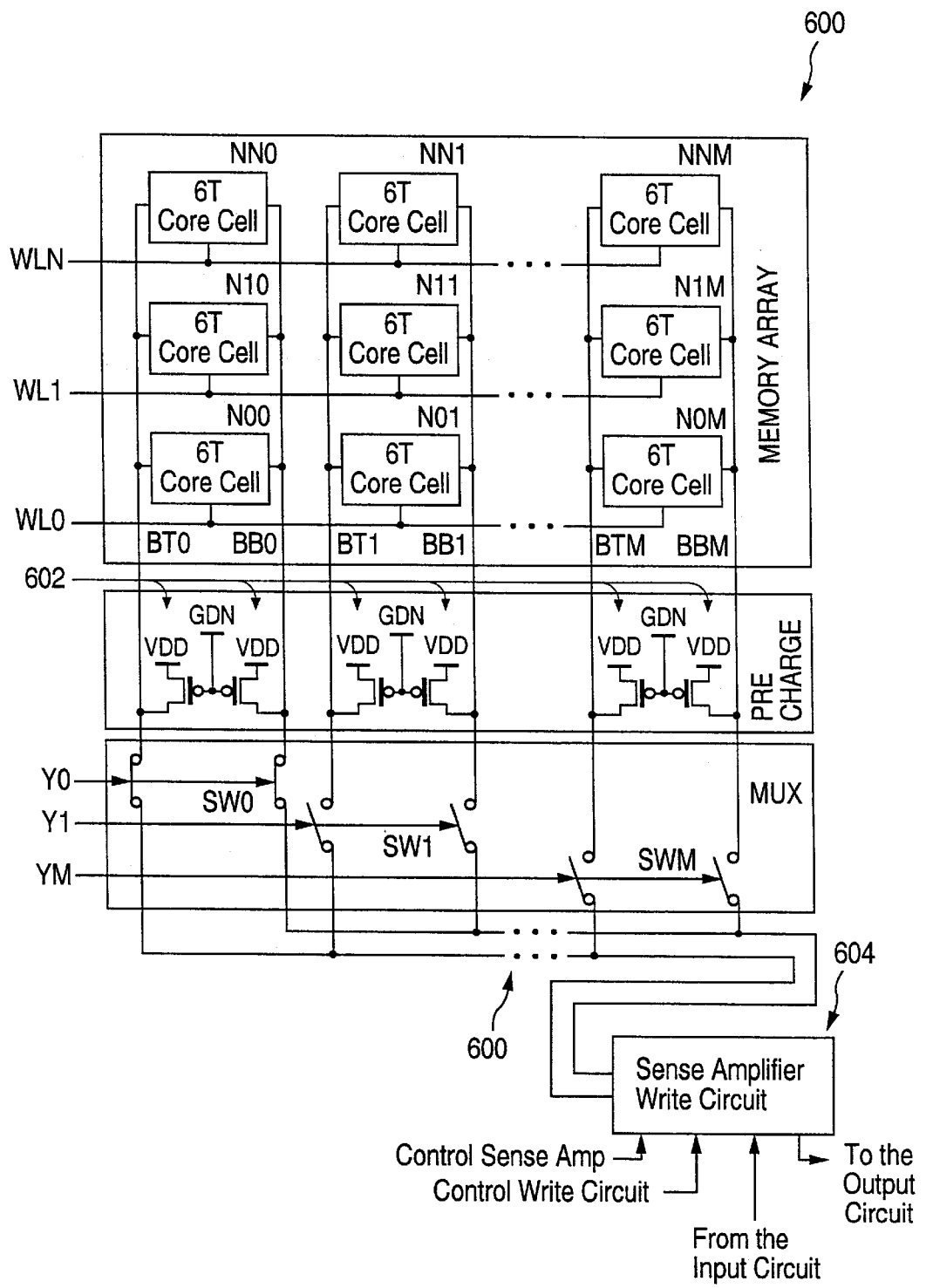
FIG. 6 is a view of an asynchronous SRAM memory system of the prior art.

It should be noted that the above figures and discussion have discussed SRAM memory systems largely in the context of a synchronous system. The SRAM cell described herein can also be used in an asynchronous system as well. FIG. 6 shows a prior art asynchronous memory system 600. In this asynchronous system 600, the precharge step discussed above is not required as the gates of the PMOS precharge transistors 602 are connected to ground. This means the memory array 606 is in a state of constant precharge and thus requires no clock signal to precharge the bitlines before each read or write cycle, i.e. when all word lines (WL0, WL1, . . . WLN) are closed all the bitlines will automatically pulled up to logic 1 by virtue of the fact that the precharge transistors are open. When one of word lines is opened, the differential voltage will immediately appear on the bitlines (BT0, BB0, BT1, BB1, . . . BTN, BBN). The disadvantage of this mode of operation in the prior art system 600 is that there is a large current (power) consumption because there is a short circuit path between Vdd and Gnd through the pmos precharge transistors 602 and the 6T memory cell for both selected and non-selected columns. (The 6T memory cells shown in FIG. 6 are the same as the cell shown in FIG. 2). Because of this issue with high power dissipation resulting from maintaining the precharge transistors in an open state this type of memory has limited the use in real designs.

In asynchronous operation in a write mode for the 6T cell (see FIG. 2), WLC is driven to logic 1, BTC is driven to logic 0 and BBC is driven to logic 1 and the cell will be programmed to logic 1. If BTC is driven to logic 1, BBC is driven to logic 0 the cell will be programmed to logic 0. The operation is identical to that used for synchronous mode operation, except that the short circuit path between Vdd and Gnd through the pmos precharge transistors 602 and the 6T memory cell exists.

In the read mode of the system shown in 600, the word line WLC is driven to logic 1 and BTC or BBC bitlines begin to discharge creating a differential voltage between BTC and BBC depending on the pre-programmed state of the bit cell. For instance if the cell was programmed logic 1 then BTC would discharge and BBC would remain at VDD level. If the cell was programmed logic 0 then BBC would discharge and BTC would remain at VDD level. The differential signal level is dependent on the relative sizes of the p-channel transistors 602 in the precharge circuit, i.e. if 6T cell is open by WL=logic 1, the differential voltage on the bitlines (defined by the current ratio between p-channel of the pmos precharge transistor 602, which is always open, and n-channel—of the nmos row select pass gate transistors 214 and 216, opened by WL of the 6t cell) should be enough to sense it by sense amplifier 604.

Figure 7:
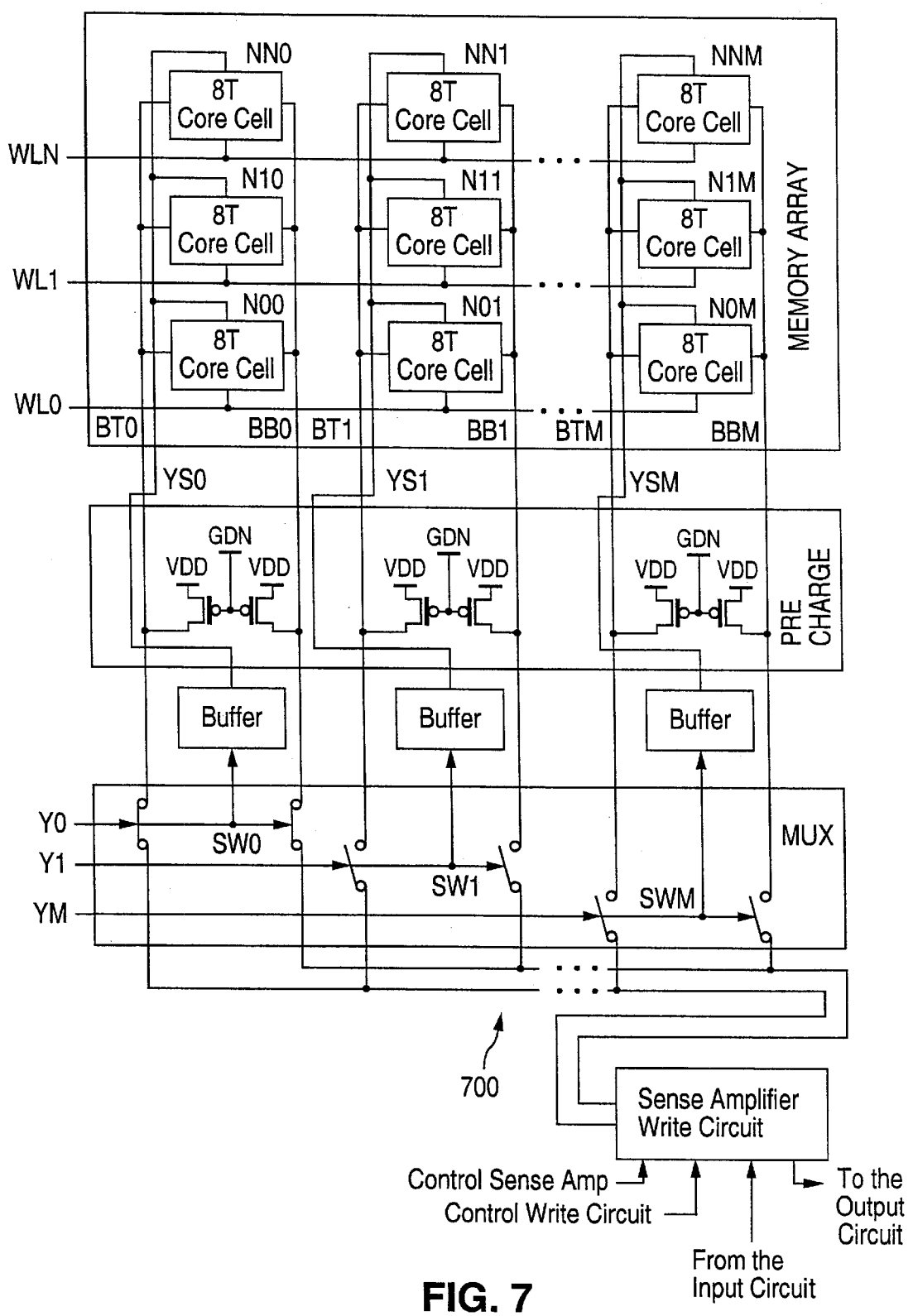
FIG. 7 is a view of an asynchronous SRAM memory system of the present invention.

FIG. 7 shows an asynchronous SRAM memory system 700 of the present invention utilizing the 8T memory cell shown in FIG. 4. Reduction in AC power dissipation for asynchronous memories is realized by utilizing the combination of column select (Y0, Y1, . . . YM) and row select signals (WL0, WL1, . . . WLN) in manner similar to that described above in connection with FIG. 3. Reduced power consumption within the memory is achieved due to the proportional reduction of the short circuit current between Vdd and Gnd as only the one selected column consumes power, while the rest of the unselected columns will be inactive and remain in the precharged state. This technique also reduces the peak AC current by the same argument.

Specifically a desired column is selected by driving the column selected signal (e.g. Y0) to logic 1, which opens the column select transistors (402 and 404) and the desired row is selected by driving the row select signal (e.g. WL0) to logic 1 which opens the row select transistors (414 and 416) in a manner described above. Thus, a SRAM asynchronous system of the present invention which utilizes the eight transistor memory cell shown in FIG. 4 instead of the six transistor memory cell of the prior art, and thereby reduces the amount of power consumed during read and write operations.

Although specific embodiments and methods of the present invention are shown and described herein, this invention is not to be limited by these methods and embodiments. Rather, the scope of the invention is to be defined by the following claims and their equivalents.

What is claimed is:

1. A static RAM bit cell for storing binary data, comprising:
   a storage cell including a plurality of transistors configured to store data;
   a first word line pass transistor coupled to the storage cell, wherein the first word line pass transistor is also coupled to a word line such that the first word line pass gate transistor can be opened and closed in response to a signal on the word line;
   a second word line pass transistor coupled to the storage cell, wherein the second word line pass transistor is coupled to the word line such that the second word line pass transistor can be opened and closed in response to a signal on the word line;
   a first column select pass transistor coupled to the first word line pass transistor wherein the first column select pass transistor is coupled to a column select pass line such that the first column select pass transistor can be opened and closed in response to a signal on the column select line; and
   a second column select pass transistor coupled to the second word line pass gate transistor wherein the second column select pass transistor is coupled to the column select line such that the second column select pass transistor can be opened and closed in response to a signal on the column select line.

2. The static RAM bit cell of claim 1, wherein the storage cell includes two load transistors, and two cross coupled data storage transistors.

3. The static RAM bit cell of claim 1, further comprising:
   a first bit line coupled to the first column select pass transistor; and
   a second bit line coupled to the second column select pass gate transistor.

4. The static RAM bit cell of claim 1, wherein the column select line is coupled to a gate of the first column select pass transistor, and wherein the column select line is coupled to a gate of the second column select pass transistor.

5. The static RAM bit cell of claim 1, wherein the word line is coupled to a gate of the first word line pass transistor, and wherein the word line is coupled to a gate of the second word line pass transistor.

6. A static RAM memory system for storing data:
   a plurality of static RAM bit cells arranged in an array which includes columns and rows of static RAM bit cells, wherein each static RAM bit cell includes a storage cell having two load transistors and two storage transistors, wherein the two load transistors and the two storage transistors are configured to store an electrical charge, and based on the stored electrical charge the bit cell is determined to store either a 1 or a 0;
   a plurality of row select lines coupled to the plurality of static RAM bit cells, wherein individual row select lines of the plurality of row select lines are coupled to a row of static RAM bit cells of the plurality of static RAM bit cells;
   a plurality of column select lines coupled to the plurality of static RAM bit cells, wherein individual column select lines of the plurality of column select lines are coupled to a column static RAM bit cells of the plurality of static RAM bit cells; and
   wherein a particular static RAM bit cell of the plurality of static RAM bit cells can be selected for writing to, or reading from, by generating a first signal on a row select line coupled to the particular static RAM bit cell, and generating a second signal on a column select line coupled to the particular static RAM bit cell.

7. The static RAM memory system of claim 6 further comprising a plurality of pairs of bit lines, wherein individual pairs of bit lines of the plurality of pairs of bit lines are coupled with individual columns of static RAM bit cells.

8. A static RAM memory system for storing data:
   a plurality of static RAM bit cells arranged in an array which includes columns and rows of static RAM bit cells;
   a plurality of row select lines coupled to the plurality of static RAM bit cells, wherein individual row select lines of the plurality of row select lines are coupled to a row of static RAM bit cells of the plurality of static RAM bit cells;
   a plurality of column select lines coupled to the plurality of static RAM bit cells, wherein individual column select lines of the plurality of column select lines are coupled to a column static RAM bit cells of the plurality of static RAM bit cells;
   wherein a particular static RAM bit cell of the plurality of static RAM bit cells can be selected for writing to, or reading from, by generating a first signal on a row select line coupled to the particular static RAM bit cell, and generating a second signal on a column select line coupled to the particular static RAM bit cell;
   a plurality of pairs of bit lines, wherein individual pairs of bit lines of the plurality of pairs of bit lines are coupled with individual columns of static RAM bit cells; and
   a precharge circuit coupled to the plurality of pairs of bit lines, wherein the precharge circuit holds the voltage on the plurality of pairs of bit lines at a precharge voltage during a static stage of operation of the static RAM memory system.

9. The static RAM memory system of claim 8 wherein the precharge circuit is coupled to the plurality of column select lines wherein when a signal is generated on a selected column select line the precharge circuit no longer maintains a precharge voltage on a selected pair of bit lines which are coupled to the static RAM bit cells in the column which corresponds to the selected column select line, but the precharge circuit continues to maintain the precharge voltage on the other pairs of bit lines of the plurality of pairs of bit lines.

10. A static RAM memory system for storing data:
    a plurality of static RAM bit cells arranged in an array which includes columns and rows of static RAM bit cells;
    a plurality of row select lines coupled to the plurality of static RAM bit cells, wherein individual row select lines of the plurality of row select lines are coupled to a row of static RAM bit cells of the plurality of static RAM bit cells;
    a plurality of column select lines coupled to the plurality of static RAM bit cells, wherein individual column select lines of the plurality of column select lines are coupled to a column static RAM bit cells of the plurality of static RAM bit cells; and
    wherein a particular static RAM bit cell of the plurality of static RAM bit cells can be selected for writing to, or reading from, by generating a first signal on a row select line coupled to the particular static RAM bit cell, and generating a second signal on a column select line coupled to the particular static RAM bit cell;

a plurality of pairs of bit lines, wherein individual pairs of bit lines of the plurality of pairs of bit lines are coupled with individual columns of static RAM bit cells; and a precharge circuit coupled to a plurality bit pairs of bit lines, wherein the precharge circuit includes a plurality of precharge transistors which are held in an open condition during read and write operations.

11. A static RAM memory system for storing data:

a plurality of static RAM bit cells arranged in an array which includes columns and rows of static RAM bit cells;

a plurality of row select lines coupled to the plurality of static RAM bit cells, wherein individual row select lines of the plurality of row select lines are coupled to a row of static RAM bit cells of the plurality of static RAM bit cells;

a plurality of column select lines coupled to the plurality of static RAM bit cells, wherein individual column select lines of the plurality of column select lines are coupled to a column static RAM bit cells of the plurality of static RAM bit cells;

wherein a particular static RAM bit cell of the plurality of static RAM bit cells can be selected for writing to, or reading from, by generating a first signal on a row select line coupled to the particular static RAM bit cell, and generating a second signal on a column select line coupled to the particular static RAM bit cell; and a plurality of pairs of bit lines, wherein individual pairs of bit lines of the plurality of pairs of bit lines are coupled with individual columns of static RAM bit cells; and a precharge circuit coupled to the plurality bit pairs of bit lines, wherein the precharge circuit includes a plurality of precharge transistors which are held in an open condition during read and write operations, and wherein the precharge transistors have gates which are coupled to ground such that the remain in an open condition during read and write operations.

12. In a static RAM memory system including a plurality of static RAM bit cells arranged in an array, which includes columns and rows of static RAM bit cells, and wherein a pair of bit lines are coupled to each of the static RAM bit cells, a method of operating the system comprising:

applying a column select signal to a selected static RAM bit cell that is in a first column of static RAM bit cells;

applying a row select signal to the selected static RAM bit cell;

applying a voltage differential to the pair of bit lines coupled to the selected static RAM bit cell to write data; and sensing a voltage differential across the pair of bit lines coupled to the selected static RAM bit cell to read data.

13. The method of claim 12 further comprising:

discharging the pair of bit lines coupled to the selected static RAM bit cell in response to the applied row select signal and the applied column select signal.

14. The method of claim 12 further comprising:

maintaining a precharge voltage on a plurality of bit lines which are not coupled to static RAM bit cells in the first column, while the pair of bit lines coupled to the selected static RAM bit cell are discharged.

* * * * *